United States Patent
Kanno et al.

[11] Patent Number: 6,138,890
[45] Date of Patent: Oct. 31, 2000

[54] AUTOMATIC SOLDERING MECHANISM CAPABLE OF IMPROVING A WORKING EFFICIENCY WITH STABILIZING A SOLDERING QUALITY

[75] Inventors: Masaru Kanno; Shinji Sasaki; Yoshiaki Atani; Toshihiro Saito, all of Miyagi, Japan

[73] Assignee: NEC Corporation, Tokyo, Japan

[21] Appl. No.: 09/182,895

[22] Filed: Oct. 30, 1998

[30] Foreign Application Priority Data

Oct. 30, 1997 [JP] Japan .................................... 9-299051

[51] Int. Cl.⁷ ..................................................... H05K 3/34
[52] U.S. Cl. ................................ 228/37; 228/35; 228/14; 228/260
[58] Field of Search ................................ 228/37, 46, 35, 228/14, 260

[56] References Cited

U.S. PATENT DOCUMENTS

| | | | |
|---|---|---|---|
| 4,784,309 | 11/1988 | Gottschild | 228/37 |
| 4,807,794 | 2/1989 | Hess | 228/102 |
| 4,824,010 | 4/1989 | Inoue et al. | 228/180.2 |
| 5,156,324 | 10/1992 | Hueste et al. | 228/180.1 |
| 5,228,614 | 7/1993 | Elliott et al. | 228/37 |
| 5,379,931 | 1/1995 | Van Schaik | 228/37 |
| 5,397,049 | 3/1995 | Gileta et al. | 228/37 |
| 5,411,200 | 5/1995 | Conners et al. . | |
| 5,981,922 | 11/1999 | Masuda et al. | 219/615 |

FOREIGN PATENT DOCUMENTS

| | | |
|---|---|---|
| 685287 | 12/1995 | European Pat. Off. . |
| 713742 | 5/1996 | European Pat. Off. . |
| 4041272 | 6/1992 | Germany . |
| 56-026785 | 2/1956 | Japan . |
| 51-44545 | 4/1976 | Japan . |
| 62-169762 | 10/1987 | Japan . |
| 63-1999064 | 8/1988 | Japan . |
| 63-248566 | 10/1988 | Japan . |
| 1-266961 | 10/1989 | Japan . |
| 3-34299 | 4/1991 | Japan . |
| 3-127896 | 5/1991 | Japan . |
| 3-95162 | 9/1991 | Japan . |
| 5-267 | 1/1993 | Japan . |
| 5-329630 | 12/1993 | Japan . |
| 6-170526 | 6/1994 | Japan . |
| 7-501657 | 2/1995 | Japan . |
| 7-202405 | 8/1995 | Japan . |
| 8-64948 | 3/1996 | Japan . |

*Primary Examiner*—Patrick Ryan
*Assistant Examiner*—Jonathan Johnson
*Attorney, Agent, or Firm*—Young & Thompson

[57] ABSTRACT

An automatic soldering mechanism is for jetting a solder jet flow to a printed-circuit board to carry out a soldering of the printed-circuit board. The automatic soldering mechanism comprises a solder tank for storing a molten solder and a solder jetting nozzle section for jetting the solder jet flow higher than a melt surface of the molten solder within the solder tank in an inert gas atmosphere.

31 Claims, 16 Drawing Sheets

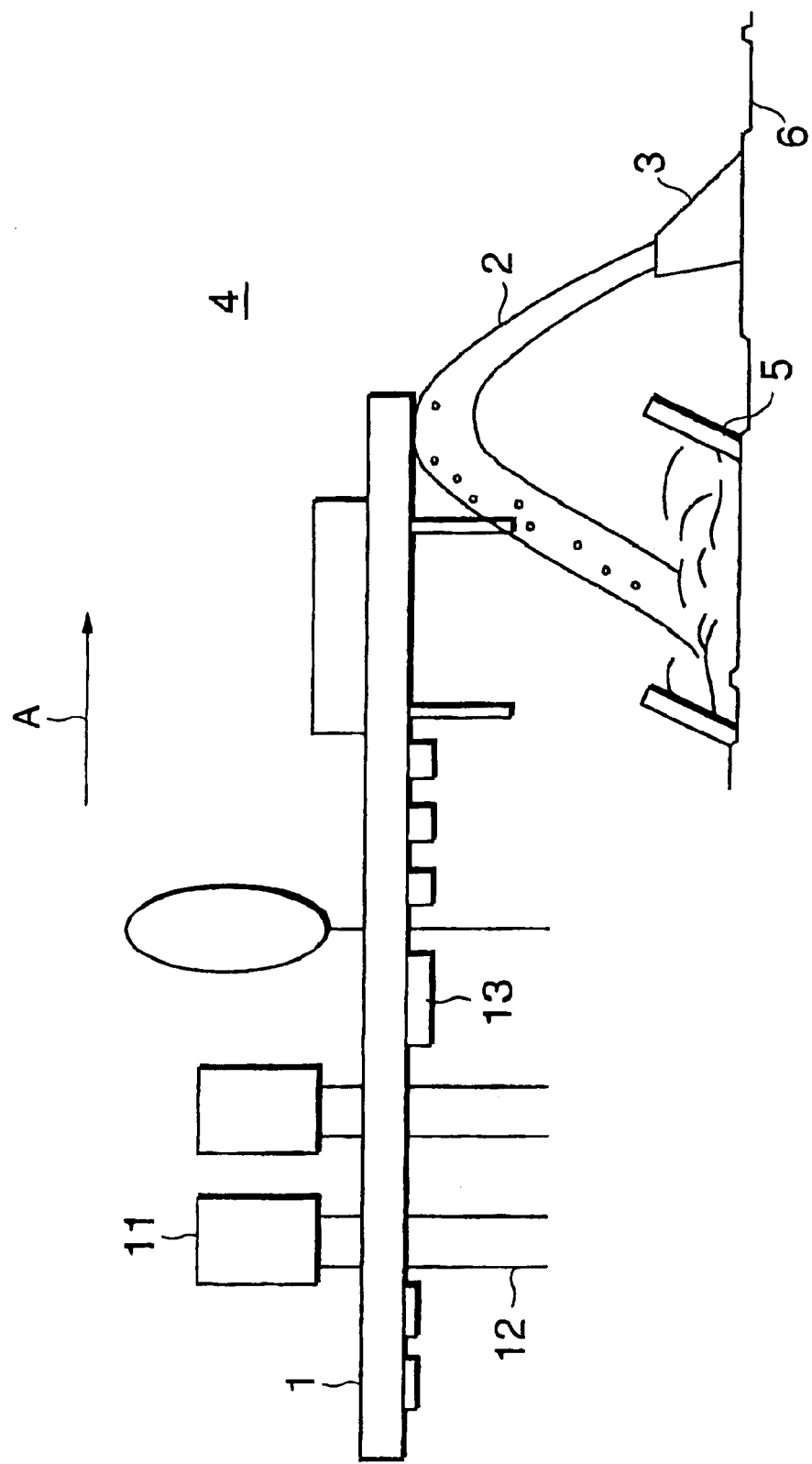

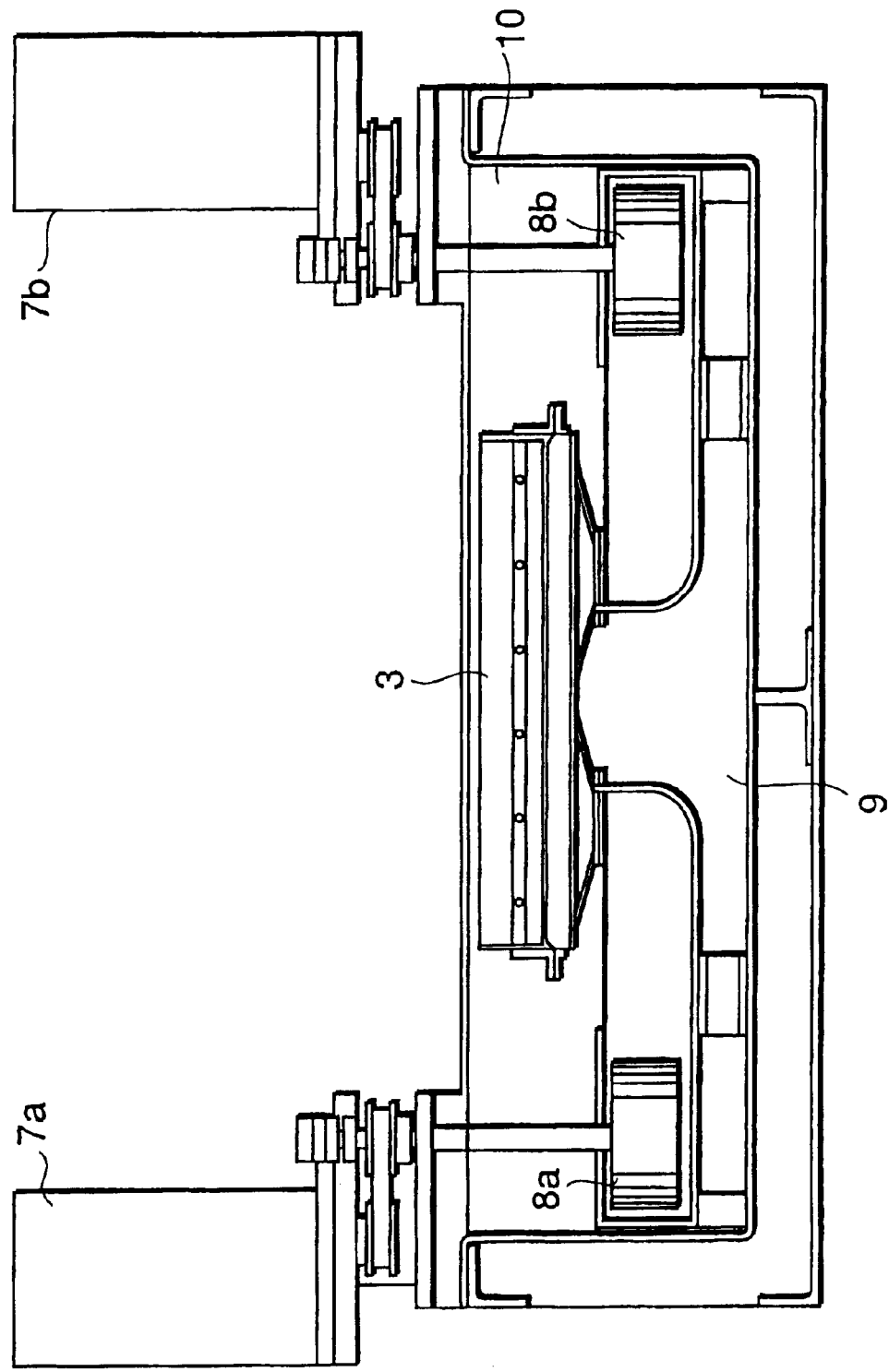

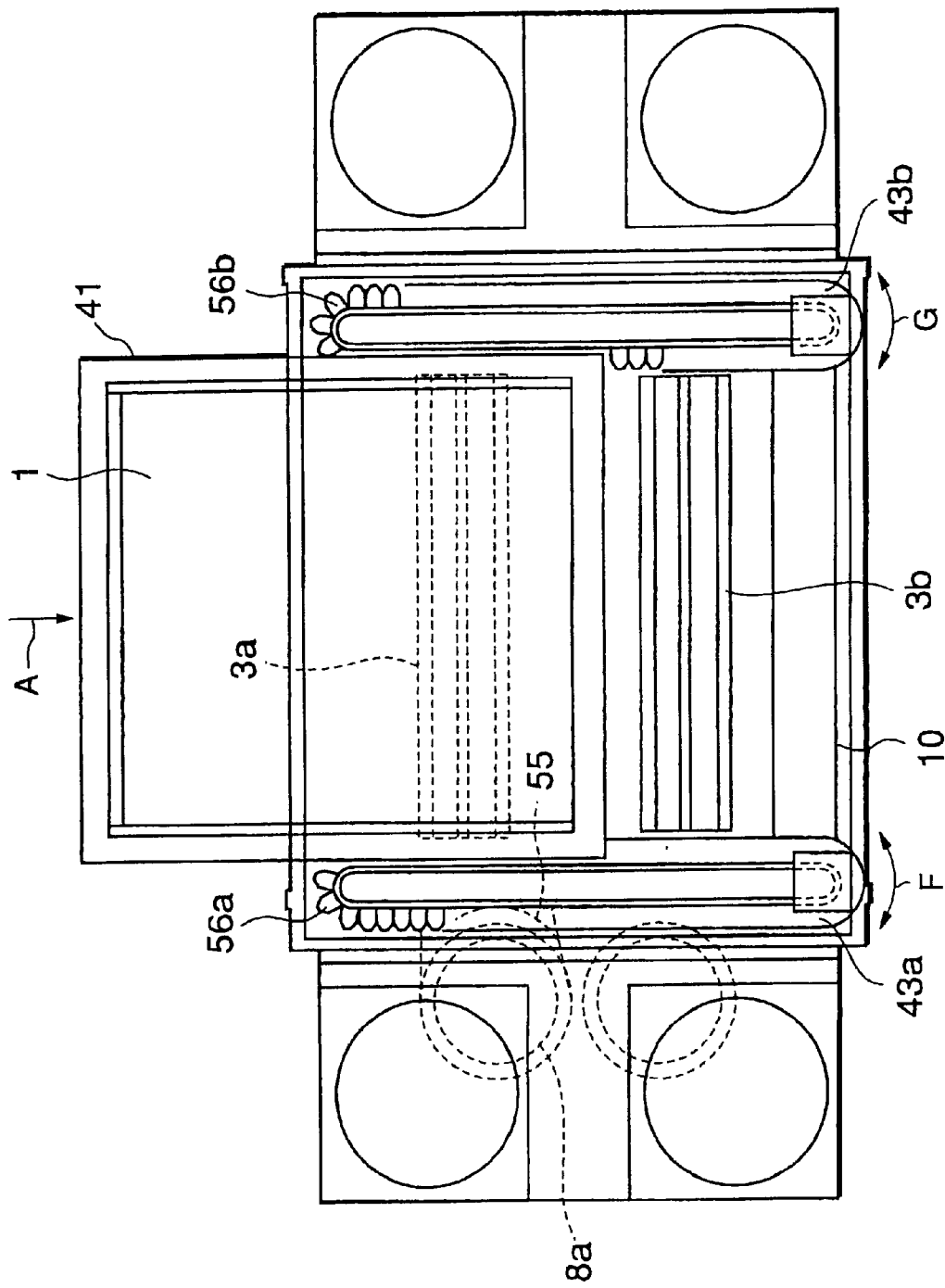

AUTOMATIC SOLDERING MECHANISM CAPABLE OF IMPROVING A WORKING EFFICIENCY WITH STABILIZING A SOLDERING QUALITY

BACKGROUND OF THE INVENTION

This invention relates to an automatic soldering mechanism and an apparatus using the automatic soldering mechanism, and more particularly, to an automatic soldering mechanism for carrying out a soldering onto a both-side mounted printed-circuit board.

In general, it is known to have a both-side mounted printed-circuit board having a front surface and a back surface. Parts with leads are mounted on the front surface. Front surface mounted device is mounted on the back surface. On soldering the both-side mounted printed-circuit board, an automatic soldering mechanism is used which jets a solder jet flow from a jetting nozzle to the back surface of the both-side mounted printed-circuit board.

The soldering is carried out in a solder tank. In the solder tank, the solder jet flow is designed to have a low height. On soldering the part with a lead, the lead of the part is cut to a short length to be inserted into the both-side mounted printed-circuit board, in order to carry out the soldering.

A conventional automatic soldering mechanism is disclosed in Japanese Utility Model Publication Jikkai Sho 62-169762 (169762/1987) and will be referred to a first conventional automatic soldering mechanism. Furthermore, another conventional automatic soldering mechanism is disclosed in Japanese Patent Publication Tokkai Hei 1-266961 (266961/1989).

In the first conventional automatic soldering mechanism, a solder melt surface is raised by a solder jet flow discharged from the jetting nozzle (the jet flow port and the blowing nozzle). In the second conventional automatic soldering mechanism, the solder is flew from above the melt surface by a guide member. Therefore, it is necessary to previously cut the lead of the electronic device to a short length in order that the lead is not brought into contact with the jetting nozzle, in each of the first and the second conventional automatic soldering mechanisms. As a result, a manual working for previously cutting the lead occurs and a lot of man-hour becomes necessary.

It is theoretically possible to jet the solder jet flow discharged from the jetting nozzle above the melt surface, but it follows that the solder jet flow is oxidized on the surface thereof before reaching the both-side mounted printed-circuit board, so that it is impossible to perform a good soldering onto the both-side mounted printed-circuit board. Accordingly, it is conventionally designed so as to swell up the solder melt surface.

Oxidation of the solder surface can be prevented by extremely lowering an oxygen concentration in an inert gas atmosphere. When the oxygen concentration is made lower than 1000 ppm by the inert gas as described in Japanese Patent Publication Tokkai Hei 8-64948(64948/1996), a solder ball inevitably occurs. Since it is generally necessary to deal with the solder ball, the height of the solder jet flow is raised in the inert gas atmosphere, but it is contradictory to a common sense for those skilled in the art to make the height higher than the solder melt surface, so that conventionally it is not performed at all.

Since it is necessary to perform a soldering under a state that the lead is inserted into the both-side mounted printed-circuit board after it has been made short, stability of the electronic device becomes deteriorated, so that there is a risk of deteriorating a quality of the soldering.

SUMMARY OF THE INVENTION

It is therefore an object of this invention to provide an automatic soldering mechanism capable of improving a working efficiency with stabilizing a soldering quality.

Other objects of this invention will become clear as the description proceeds.

On describing the gist of this invention, it is possible to understand that an automatic soldering mechanism for jetting a solder jet flow to a printed-circuit board is used to carry out a soldering of the printed-circuit board.

According to a first aspect of this invention, the automatic soldering mechanism comprises a solder tank for storing a molten solder and solder jetting nozzle means for jetting the solder jet flow higher than a melt surface of the molten solder within the solder tank in an inert gas atmosphere.

It is possible to understand that an automatic soldering apparatus for jetting a solder jet flow to a printed-circuit board having at least one lead is used to carry out a soldering of the printed-circuit board.

According to a second aspect of this invention, the automatic soldering apparatus comprises (A) a board carrier mechanism for carrying the printed-circuit board to a carrier, (B) a flux applying mechanism for applying a flux to a back surface of the printed-circuit board on the carrier to process the printed-circuit board into a flux board, (C);a preliminary heating mechanism for preliminarily heating the flux board into a heated board, (D) an automatic soldering mechanism comprising a solder tank for storing a molten solder and solder jetting nozzle means for jetting the solder jet flow higher than a melt surface of the molten solder within the solder tank in an inert gas atmosphere, the automatic soldering mechanism carrying out the soldering to the heated board to process the heated board into a soldered board, (E) a cooling mechanism for cooling the soldered board into cooled board, and (F) an automatic cutter mechanism for cutting the lead of the cooled board to a predetermined length.

BRIEF DESCRIPTION OF THE DRAWINGS

FIG. 4 shows a side view for describing the soldering process illustrated in FIG. 3;

FIG. 6 shows a side view with a partial section of an automatic soldering mechanism according to an embodiment of this invention;

FIG. 15 shows a plan view of the automatic soldering mechanism illustrated in FIG. 14;

DESCRIPTION OF THE PREFERRED EMBODIMENTS

Figure 1:
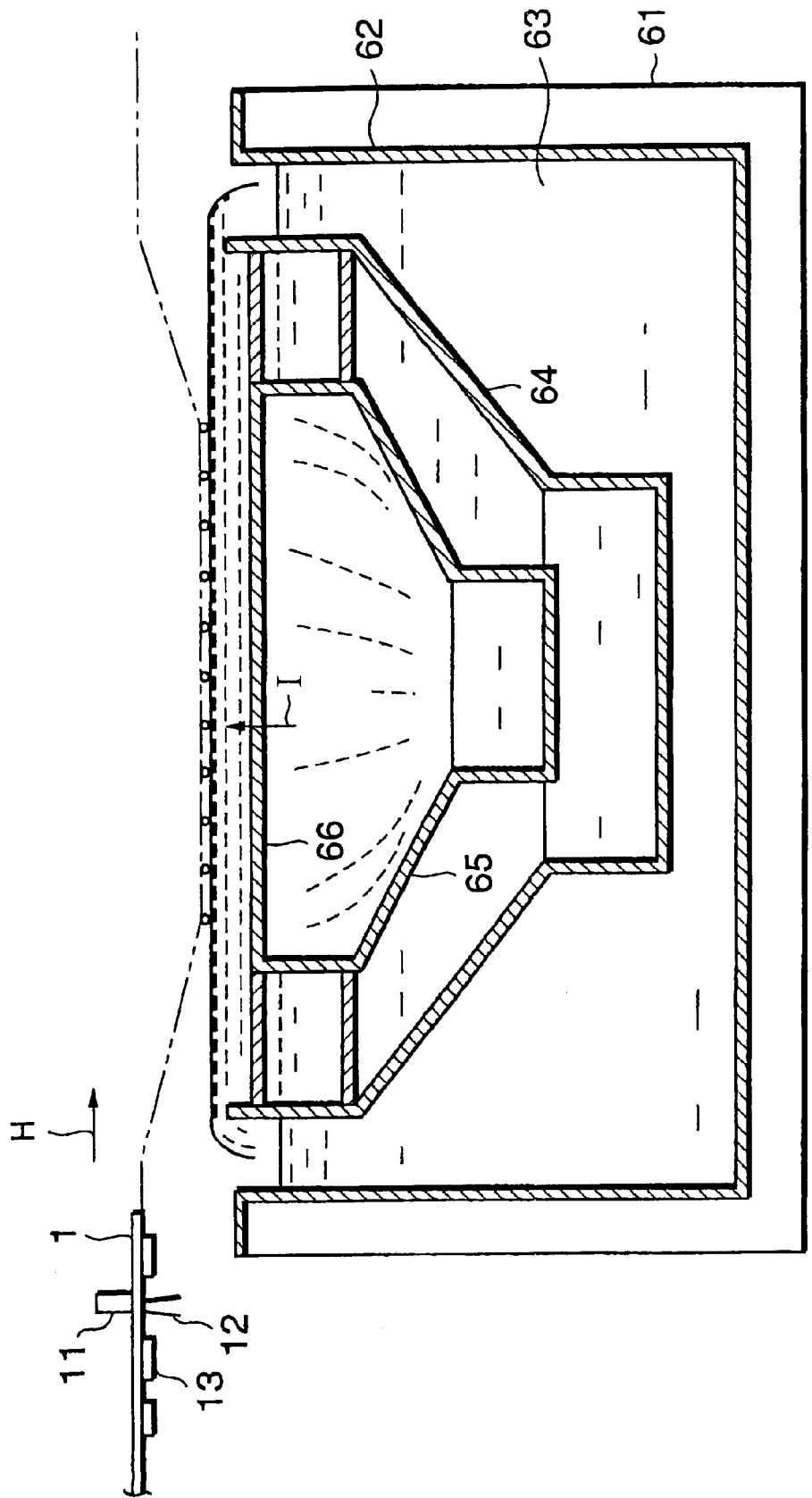
FIG. 1 shows a sectional view of a first conventional automatic soldering mechanism.

Referring to FIG. 1, a first conventional automatic soldering mechanism will be described at first in order to facilitate an understanding of this invention. The illustrated automatic soldering mechanism comprises a solder tank 61 having a main body 62 in which a flow dip tank 64 is located. A jet flow tank 65 having a jet flow port 66 is disposed in the flow dip tank 64. A solder melt 63 is jetted from the jet flow port 66 in order to solder a lead 12 of an electronic device 11 and a front surface-mounted device 13 on the both-side mounted printed-circuit board 1.

Figure 2:
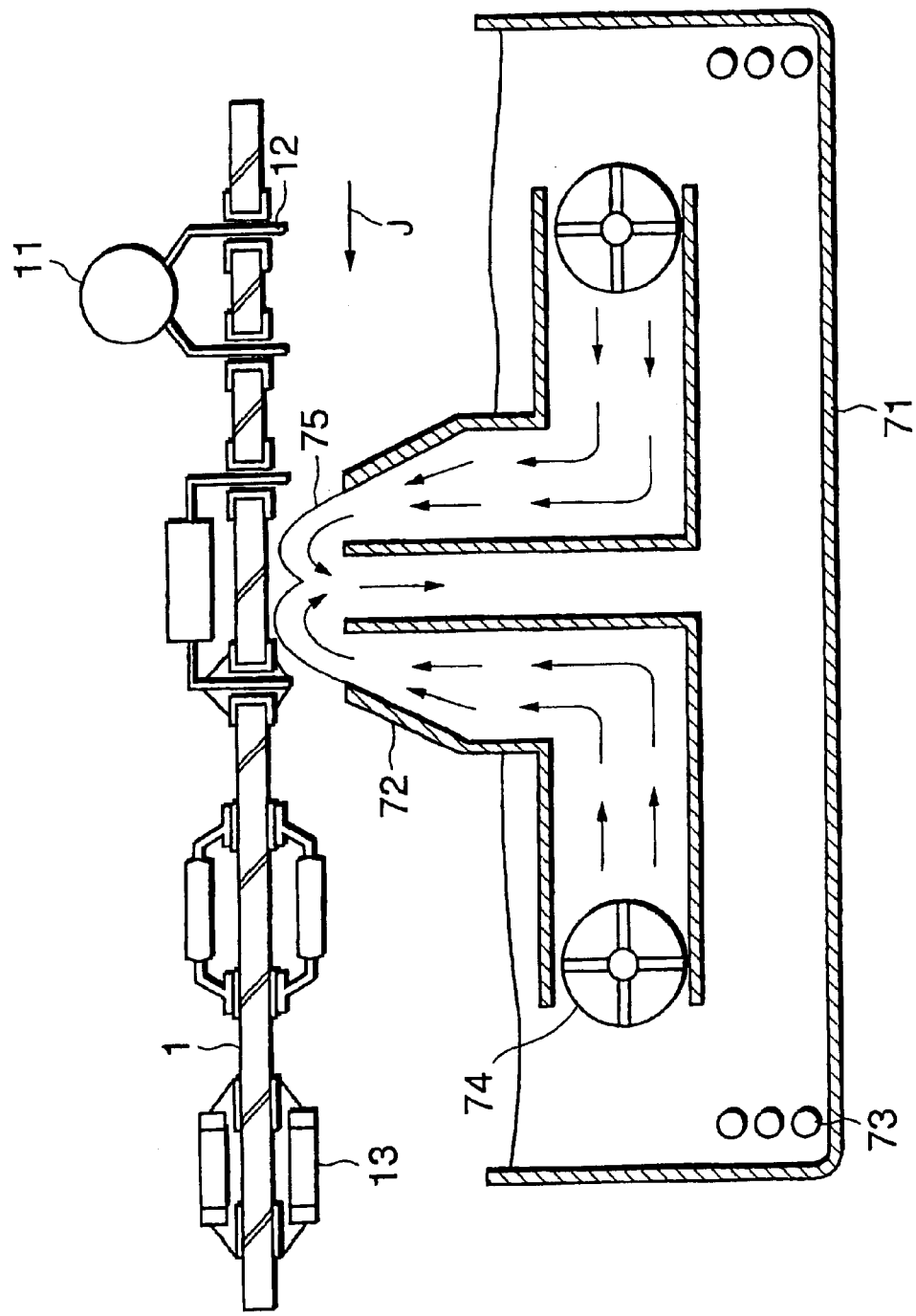
FIG. 2 shows a sectional view of a second conventional automatic soldering mechanism.

Referring to FIG. 2, description will be made as regards a second conventional automatic soldering mechanism. The illustrated automatic soldering mechanism comprises a jet flow solder tank 71 in which a pump 74 is located. The pump 74 pumps a solder melt 75 which is discharged from a blowing nozzle 72, in order to solder a lead 12 of an electronic device 11 and a front surface-mounted device 13 on the both-side mounted printed-circuit board 1.

As described above, it is difficult to improve a working efficiency with stabilizing a soldering quality in each of the first and the second automatic soldering mechanisms.

Figure 3:
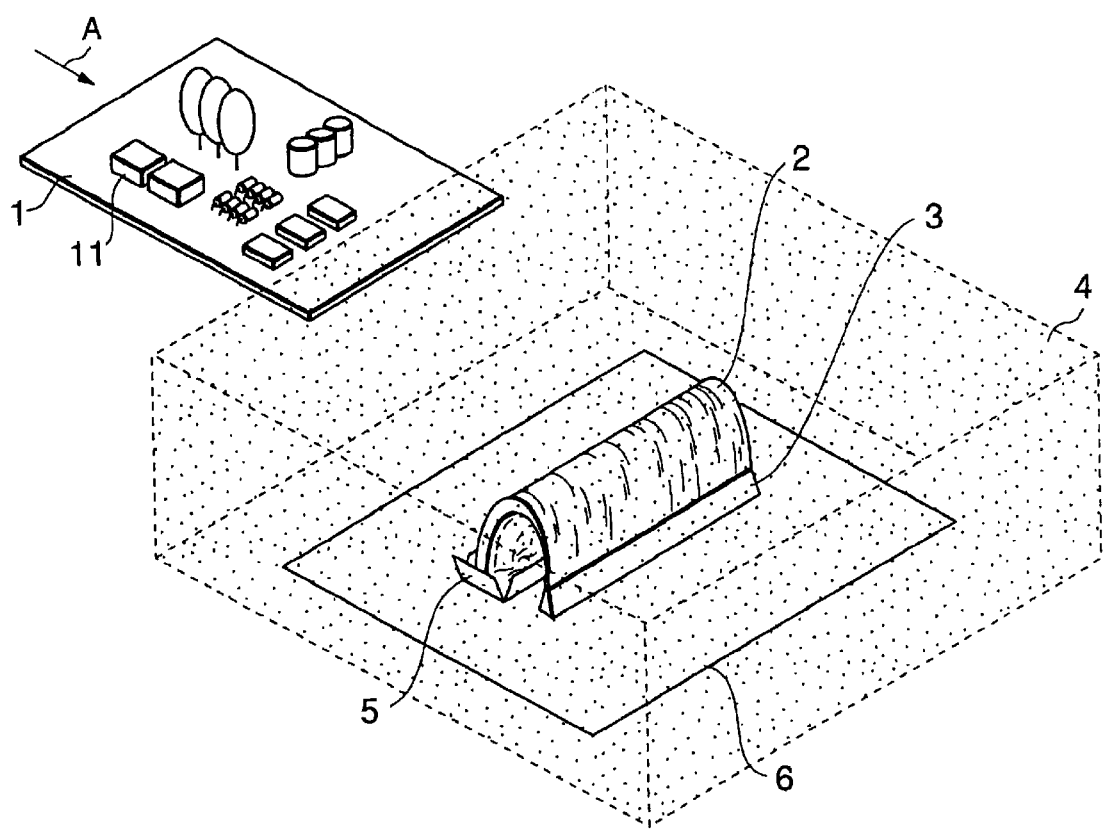
FIG. 3 shows a schematic view for describing a soldering process according to an embodiment of this invention.

Referring to FIG. 3 together with FIG. 4, a solder 2 is jetted high from a solder jetting nozzle 3 in an inert gas atmosphere 4 in the illustrated automatic soldering mechanism, in order to carry out a soldering to a lead 12 (beneath the board 1, as shown in FIGS. 1 and 2) of an electronic device 11 and a surface-mounted device 13 on a back surface of a both-side mounted printed-circuit board 1 which is transferred in a direction of an arrow A. Nitrogen may be used, for example, as an inert gas.

Inasmuch as the solder 2 is jetted high from the solder jetting nozzle 3 in the inert gas atmosphere 4, the surface of the solder 2 is not oxidized. However, the solder ball inevitably occurs when the oxygen concentration is made lower than 100 ppm by the inert gas, as described in Japanese Patent Publication Tokkai Hei 8-64948. In the example being illustrated, the solder ball is generated by a rebound of the solder 2 when the solder jet flow curtain due to the jet flow of the solder 2 drops on a melt surface 6 of the molten solder. The solder ball is shielded by a shielding member 5 having a perforated plate. In addition, the inert gas atmosphere 4 is set such that the concentration of the oxygen is 50 ppm or less and the molten solder is set to 245±5° C. Furthermore, a transferring speed of the both-side mounted printed-circuit board 1 is set to, for example, 0.7 m/min in order that the solder 2 is brought into contact with the lead 12 and the surface-mounted device 13 for 3 to 5 seconds.

The soldering jetting nozzle 3 is arranged to project to the both-side mounted printed-circuit board 1 side from the melt surface 6 of the molten solder and to face the jet flow of the solder 2 jetted from the solder jetting nozzle 3 to the transferred both-side mounted printed-circuit board 1. The soldering jetting nozzle 3 may be set to be substantially the same height as the solder melt surface. In this case, an enclosure is provided around the nozzle so that the oxide layer on the solder melt surface does not intermingle with the solder jet flow.

Figure 5A:
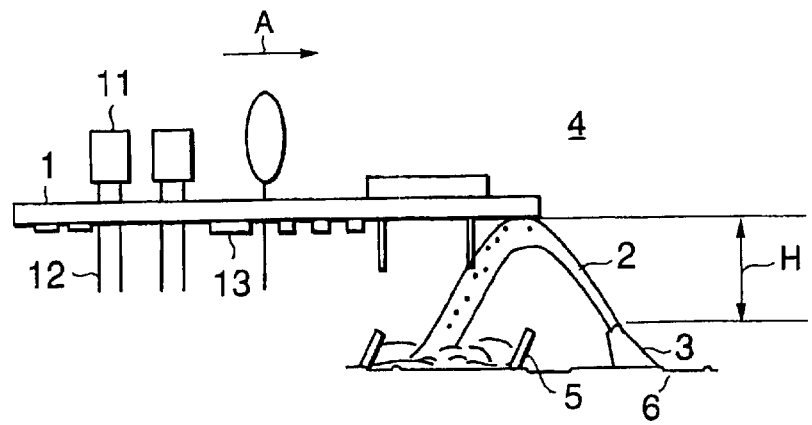
FIG. 5A shows a view for illustrating a state of starting a soldering.
Figure 5B:
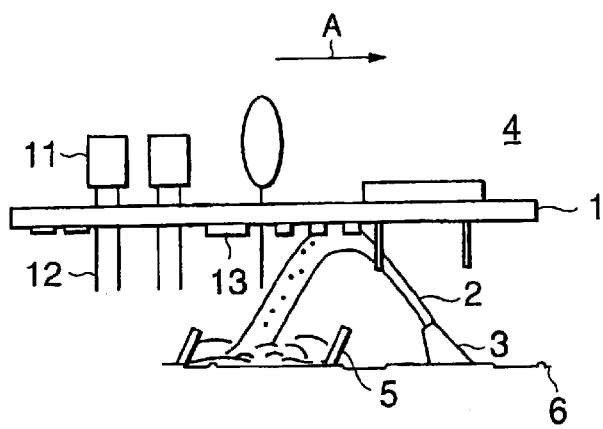
FIG. 5B shows a view for illustrating a state of performing a soldering.
Figure 5C:
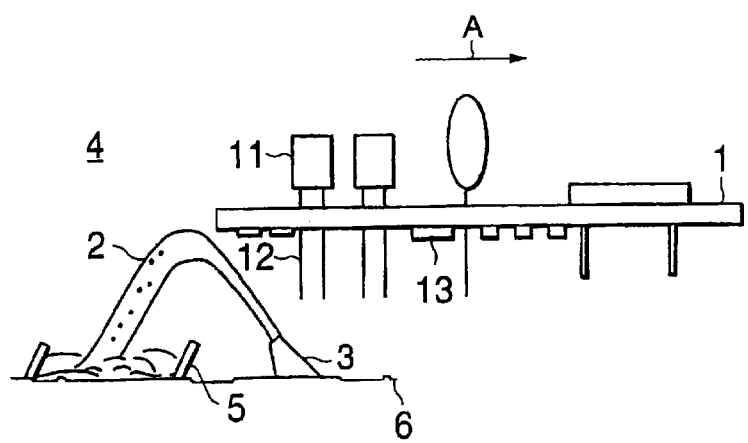
FIG. 5C shows a view for illustrating a state of finishing a soldering.

Referring to FIGS. 5A to 5C, the solder 2 is jetted high in the inert gas atmosphere 4 from the solder jetting nozzle 3 projecting to the both-side mounted printed-circuit board 1 side from the melt surface 6 of the molten solder in such a manner that a top portion of the jet flow of the solder 2 reaches a back surface of the both-side mounted printed-circuit board 1 including a length (including a length to be cut) of the lead 12 of the electronic device 11 projecting from the back surface of the both-side mounted printed-circuit board 1. That is, a position of the discharge port of the solder jetting nozzle 3 is made lower than the lowest end portion of the lead 12.

Under the circumstances, it is passed in such a manner that the back surface of the both-side mounted printed-circuit board 1 is brought into contact with the solder 2. At that time, a height H of the jet flow of the solder 2 is greater than the length of the lead 12 of the electronic device 11. Therefore, the lead 12 is not brought into contact with the solder jetting nozzle 3. Inasmuch as the soldering is carried out with respect to the both-side mounted printed-circuit board 1 while being transferred in the inert gas atmosphere 4, the surface of the solder 2 jetted high from the solder jetting nozzle 3 is not oxidized, so that it is possible to perform a good soldering with respect to the both-side mounted printed-circuit board 1.

In the soldering process, the soldering operation of the both-side mounted printed-circuit board 1 can be carried out by one step without previously working. Accordingly, it becomes possible to subject it to an automatic cutter after completing the soldering. As a result, the lead cutting operation can be made efficient. The soldering can be carried out while the lead 12 is attached. In addition, the soldering can be carried out under a stable state of the electronic device 11. Therefore, it is possible to stabilize soldering quality.

Figure 7A:
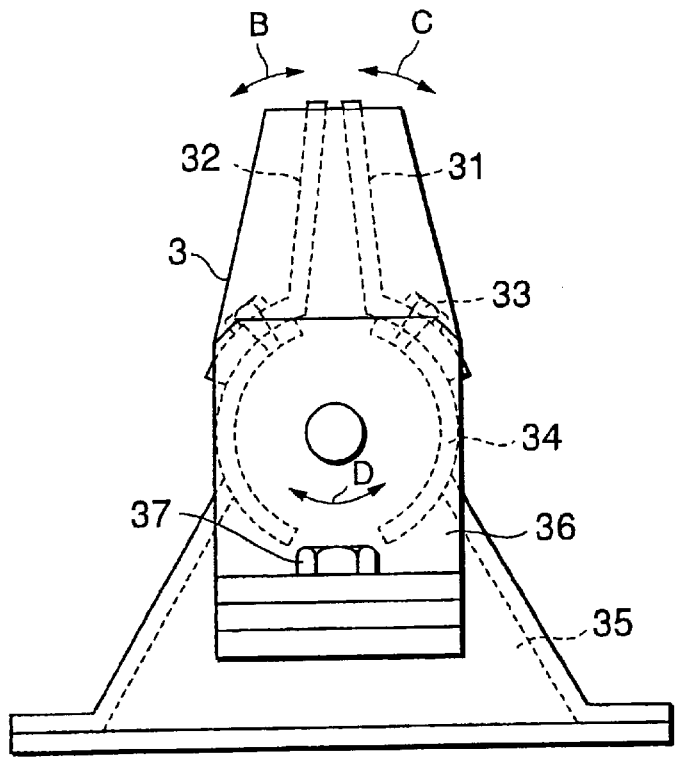
FIG. 7A shows a front view of a solder jetting nozzle used in automatic soldering mechanism illustrated in FIG. 6.
Figure 7B:
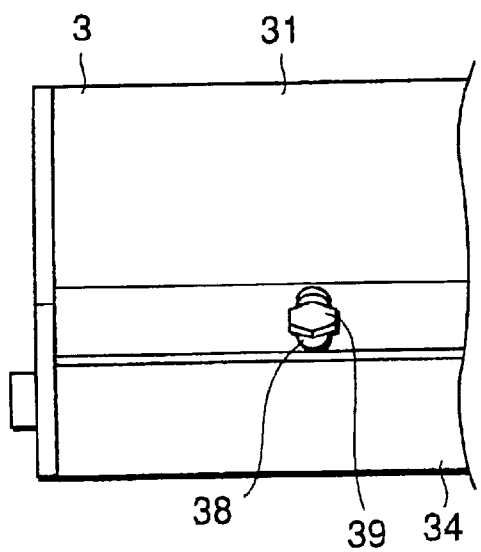
FIG. 7B shows a side view of the solder jetting nozzle illustrated in FIG. 7A.

Referring to FIG. 6 in addition to FIGS. 7A and 7B, the illustrated automatic soldering mechanism comprises a solder jetting nozzle 3, motors 7a and 7b, fans 8a and 8b, a piping 9, and a solder tank 10. The solder jetting nozzle 3 comprises a right nozzle 31, a left nozzle 32, nozzle fixing screws 33 for fixing the right nozzle 31 and the left nozzle 32, a nozzle pipe 34 having holes in upper and lower portions, a nozzle base 35, nozzle pipe fixing brackets 36 for fixing the nozzle pipe 34, and nozzle pipe fixing screws 37. The nozzle pipe 34 is arranged on the nozzle base 35 to be nipped by the nozzle pipe fixing brackets 36 on both sides for supporting. It is possible to be fixed at an optional angle D when the nozzle pipe fixing brackets 36 is fixed by means of the nozzle pipe fixing screws 37. In addition, the right nozzle 31 and the left nozzle 32 are fixed to the nozzle pipe 34 by the nozzle fixing screws 33. An elongate hole 38 is provided in each of the right nozzle 31 and the left nozzle 32. On adjusting a fixing position by using the elongate hole 38, it is possible to move the right nozzle 31 and the left nozzle 32 in directions of arrows B and C, respectively. As readily understood from the above description, it is possible to change the jetting direction of the solder 2 in the solder jetting nozzle 3. It is possible to change a diameter of the discharge port of the solder jetting nozzle 3. In this case, it is possible to adjust a curtain thickness of the solder jet flow curtain due to the jet flow of the solder 2 to a desired curtain thickness by varying the diameter of the discharge port of the solder jetting nozzle 3. When the diameter of the discharge port of the solder jetting nozzle 3 is made too small, the solder jet curtain is not formed. When the diameter of the discharge port of the solder jetting nozzle 3 is made too large, the solder jet flow is not jetted to a desired height.

When the fans 8a and 8b are rotated by the motors 7a and 7b, the solder 2 is taken into the piping 9 from the solder tank 10 by the fans 8a and 8b and is jetted from the solder jetting nozzle 3. Although an unnecessary material such as an oxide floats on the melt surface 6 of the molten solder, the unnecessary material is not taken into the piping 9 by the operation mentioned above.

Inasmush as the height H of the jet flow of the solder 2 is dependent upon a rotating speed of the motors 7a and 7b, the height H of the jet flow of the solder 2 can be adjusted by adjusting an inverter (not shown) which controls the motors 7a and 7b. Inasmuch as the inverter can control a rotational cycle of the motors 7a and 7b to a degree of about 0 to 60 Hz, the height H of the jet flow of the solder 2 can be optionally set within a range of a height corresponding to the rotational cycle.

Figure 8A:
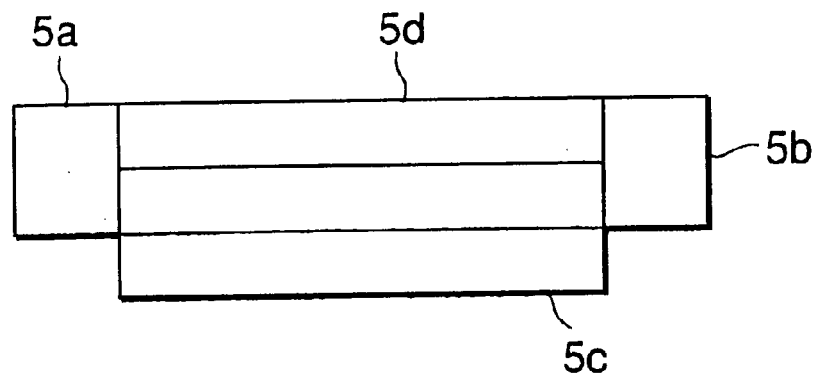
FIG. 8A shows a plan view of a shielding member illustrated in FIG. 3.
Figure 8B:
FIG. 8B shows side view of the shielding member illustrated in FIG. 8A.
Figure 8C:
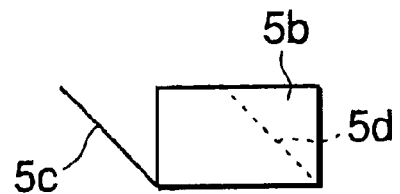
FIG. 8C shows a front view of the shielding member illustrated in FIG. 8A.

Referring to FIGS. 8A to 8C, the shielding member 5 is comprises perforated plates 5a to 5d. The perforated plates 5a and 5b are bent in an opposite direction to each other. The perforated plates 5c and 5d are bent in the same direction. The bending angle is set so as to shield the solder ball generated by a rebound of the jet flow curtain of the solder 2 at a drop point. The shielding member 5 is mounted to the solder jetting nozzle 3 or the solder tank 10 by a supporting member (not shown) so as to be positioned near the drop point of the jet flow curtain of the solder 2. The mounting position of the shielding member 5 is also set so as to shield the solder ball generated by the rebound of the jet flow curtain of the solder 2 at the drop point.

Figure 9:
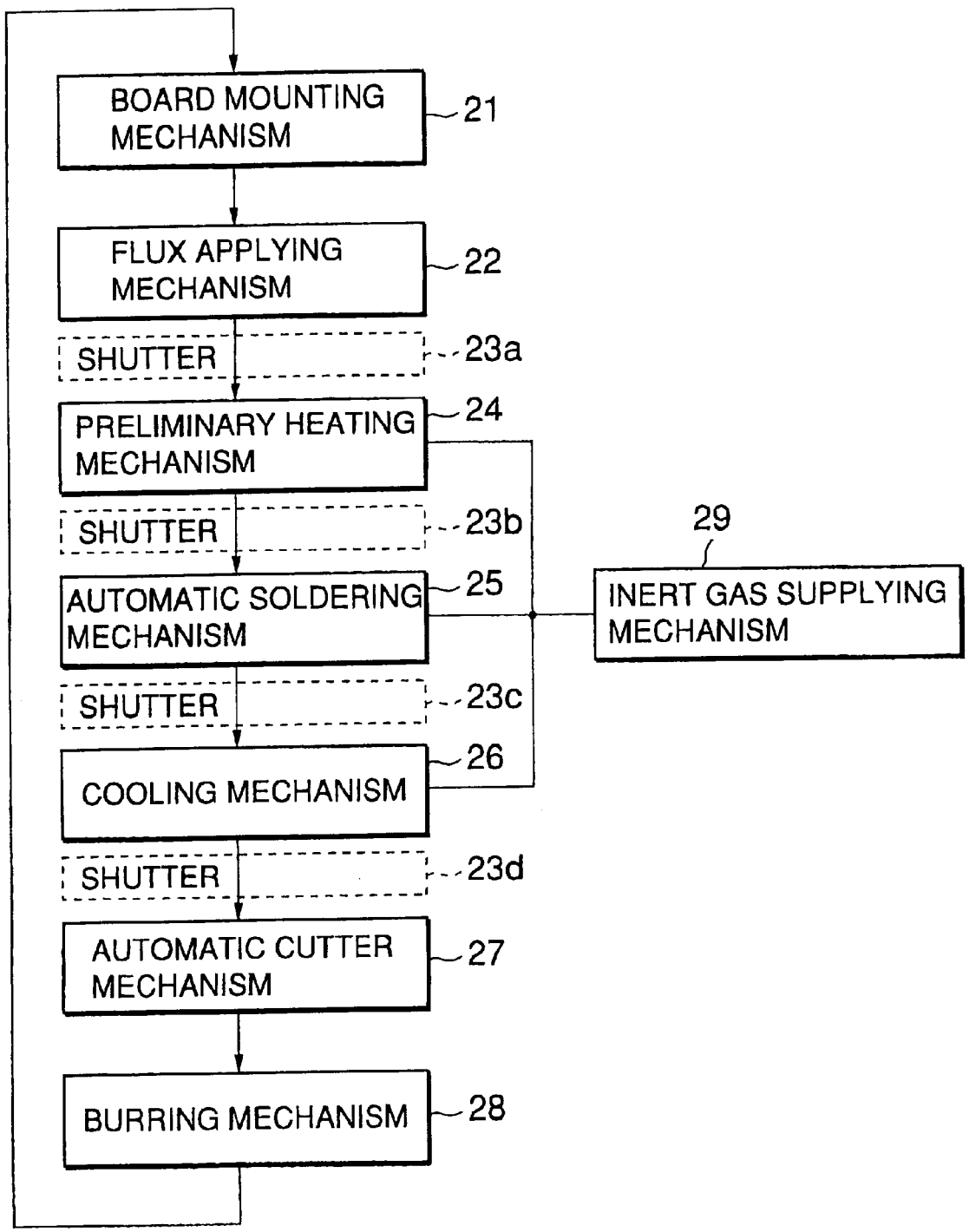
FIG. 9 is a block diagram of an automatic soldering apparatus according to an embodiment of this invention.

Referring to FIG. 9, description will proceed to an automatic soldering apparatus having the above-mentioned automatic soldering mechanism. The illustrated automatic soldering apparatus comprises a board mounting mechanism 21 for a carrier, a flux applying mechanism 22, shutters 23a to 23d, a preliminary heating mechanism 24, an automatic soldering mechanism 25, a cooling mechanism 26, an automatic cutter mechanism 27, a burring mechanism 28, and an inert gas supplying mechanism 29. The board mounting mechanism 21 is a mechanism for mounting the both-side mounted printed-circuit board 1 to a carrier (not shown) which is for transferring the both-side mounted printed-circuit board 1. The flux applying mechanism 22 is a mechanism for applying a flux to the back surface of the both-side mounted printed-circuit board 1 on the carrier. The preliminary heating mechanism 24 is a mechanism for preliminarily heating the both-side mounted printed-circuit board 1 having the back surface to which the flux is applied. The automatic soldering mechanism 25 is a mechanism for carrying out the soldering operation with respect to the both-side mounted printed-circuit board 1 which is preliminarily heated by the preliminary heating mechanism 24. The cooling mechanism 26 is a mechanism for cooling the both-side mounted printed-circuit board 1 after the soldering operation is carried out by the automatic soldering mechanism 25. The automatic cutter mechanism 27 is a mechanism for cutting and aligning the lead 12 fixed by the soldering operation in the automatic soldering mechanism 25 to a predetermined length. The automatic cutter mechanism 27 cuts and aligns the lead 12 so that the length of the lead 12 is about the same as a height of the surface-mounted device 13. The burring mechanism 28 is a mechanism for removing a burr in each part of the both-side mounted printed-circuit board 1.

The shutters 23a to 23d are opened and closed when the carrier is transferred from the flux applying mechanism 22 into the preliminary heating mechanism 24. The shutters 23a to 23d are opened and closed when the carrier is transferred from the preliminary heating mechanism 24 into the automatic soldering mechanism 25. Similarly, the shutters 23a to 23d are opened and closed when the carrier is transferred from the automatic soldering mechanism into the cooling mechanism 26. In this event, the inert gas supplying mechanism 29 always supplies the inert gas to the preliminary heating mechanism 24, the automatic soldering mechanism 25, and the cooling mechanism 26, respectively. The oxygen concentration in the automatic soldering mechanism 25 is maintained in a low concentration.

Inasmuch as the inert gas atmosphere 4 is formed within the preliminary heating mechanism 24 and the cooling mechanism 26 in spite of the fact that the shutters 23a to 23d are opened and closed, the oxygen concentration within the automatic soldering mechanism 25 can be easily maintained in the low concentration.

In the above-mentioned automatic soldering apparatus, the carrier successively circulates the board mounting mechanism 21, the flux applying mechanism 22, the preliminary heating mechanism 24, the automatic soldering mechanism 25, the cooling mechanism 26, the automatic cutter mechanism 27, and the burring mechanism 28. The carrier is returned to the board mounting mechanism 21 after the burring mechanism 28. Therefore, it is possible to make each of the mechanisms mentioned above be compact. Furthermore, it is possible to make the automatic soldering apparatus be compact when each of the mechanisms is arranged such that the carrier circulates each of the mechanisms.

Figure 10:
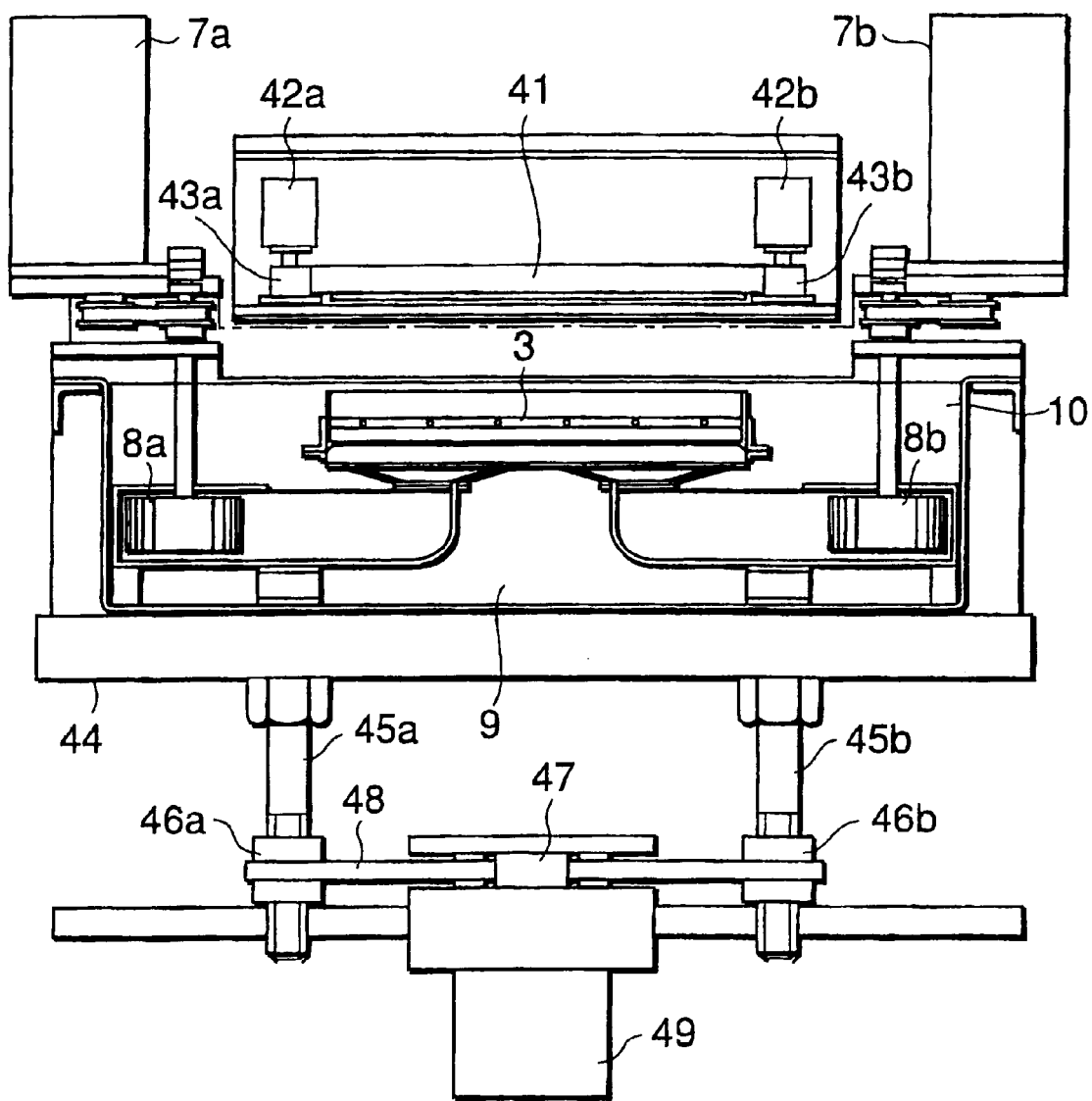
FIG. 10 shows a side view with a partial section of an automatic soldering mechanism according to another embodiment of this invention.
Figure 11:
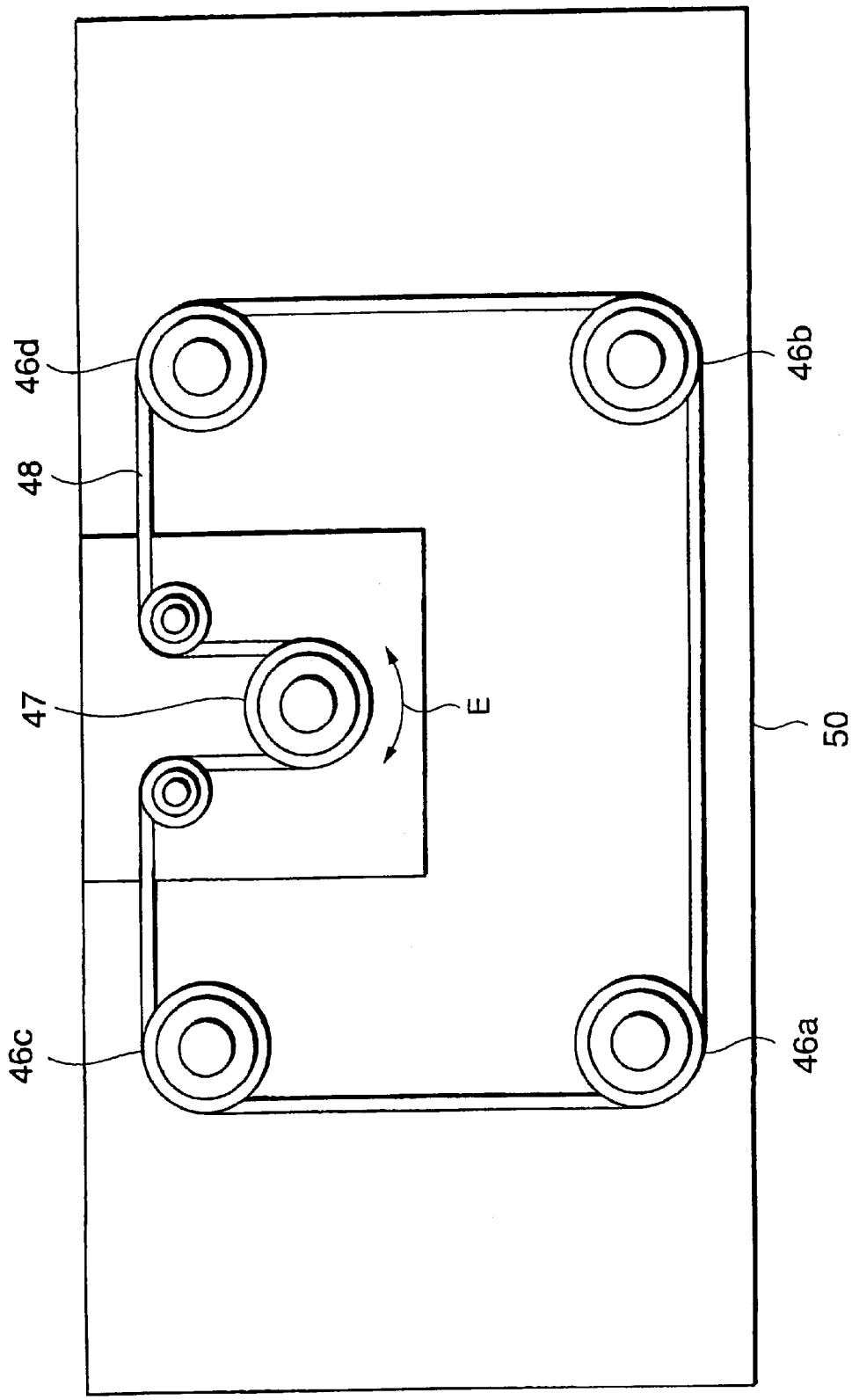
FIG. 11 shows a plan view of a vertically moving mechanism for a solder tank illustrated in FIG. 10.

Referring to FIGS. 10 and 11, description will proceed to an automatic soldering mechanism according to another embodiment of this invention. The illustrated automatic soldering mechanism comprises a solder jetting nozzle 3, motors 7a and 7b, fans 8a and 8b, a piping 9, a solder tank 10, a carrier 41, drive motors 42a and 42b, carrier transferring chains 43a and 43b, a base 44, base feet 45a to 45d, gears 46a to 46d, a drive gear 47, a chain 48, and a vertical movement motor 49. The carrier 41 carries or mounts the both-side mounted printed-circuit board 1 to circulate within an automatic soldering apparatus which comprises similar mechanisms illustrated in FIG. 9 except for the automatic soldering mechanism illustrated in FIG. 10. The drive motors 42a and 42b and the carrier transferring chains 43a and 43b are arranged on both sides of the carrier 41 so as to hold the carrier 41 therebetween. Each of the drive motors 42a and 42b rotates the carrier transferring chains 43a and 43b in a direction opposite to each other, in order to transfer the carrier 41 in the transferring direction thereof.

The base 44 supports the solder tank 10. The base feet 45a to 45d support the base 44. The gears 46a to 46d are meshed with screw portions of the base feet 45a to 45d. The base feet 45a to 45d vertically move by rotation of the gears 46a to 46d. The driving gear 47 is applied with a rotational force from the vertical movement motor 49. When the drive gear 47 rotates in a direction of an arrow E, the driving gear 47 drives the chain 48 to rotate the gears 46a to 46d. The gears 46a to 46d transmit the rotational force to the base feed 45a to 45d through the screw portion. As a result, the base feed 45a to 45d vertically move the base 44. It is possible to adjust the automatic soldering mechanism in response to the length of the lead 12.

Figure 12:
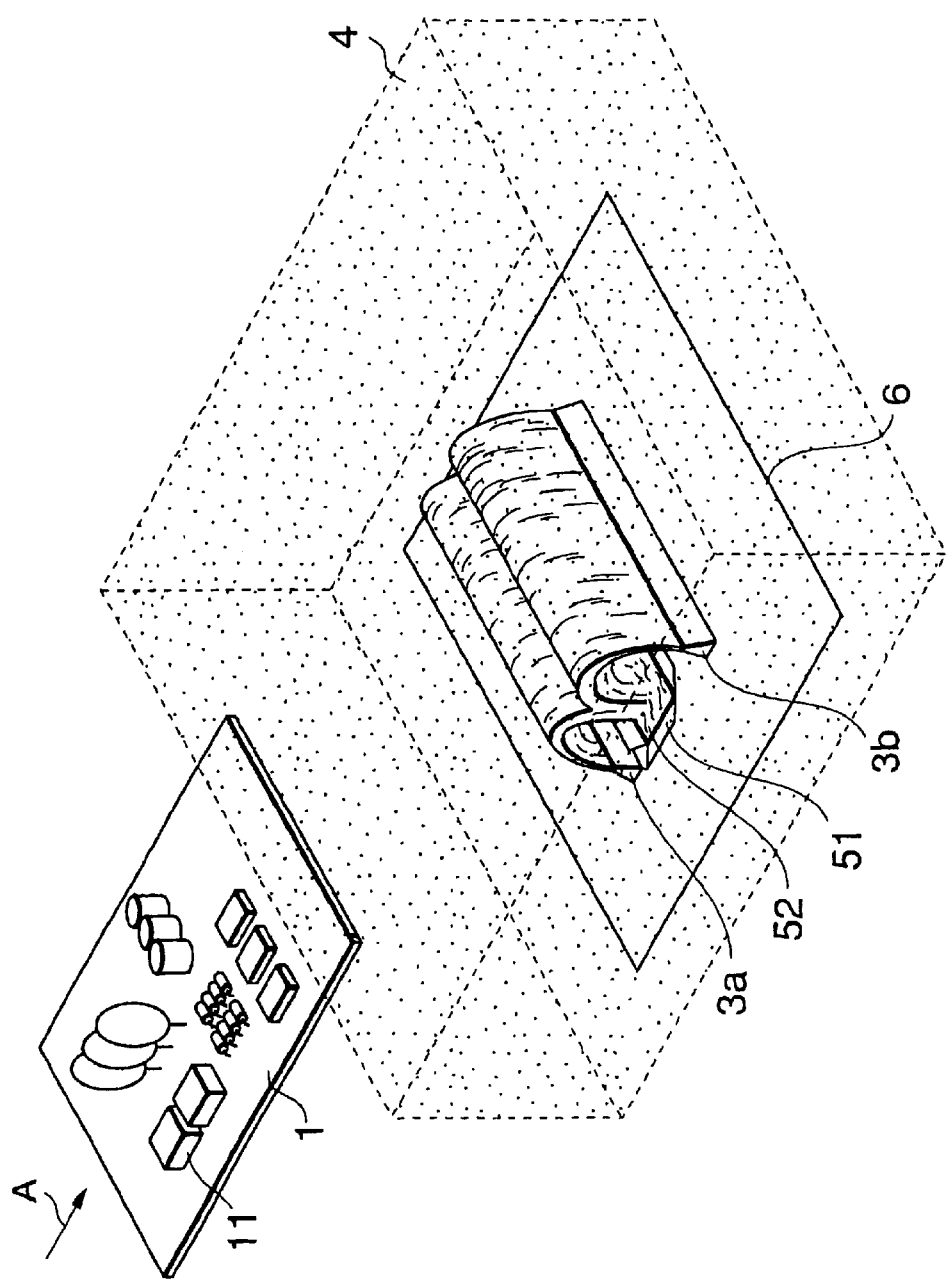
FIG. 12 shows a schematic view for describing a soldering process according to another embodiment of this invention.
Figure 13:
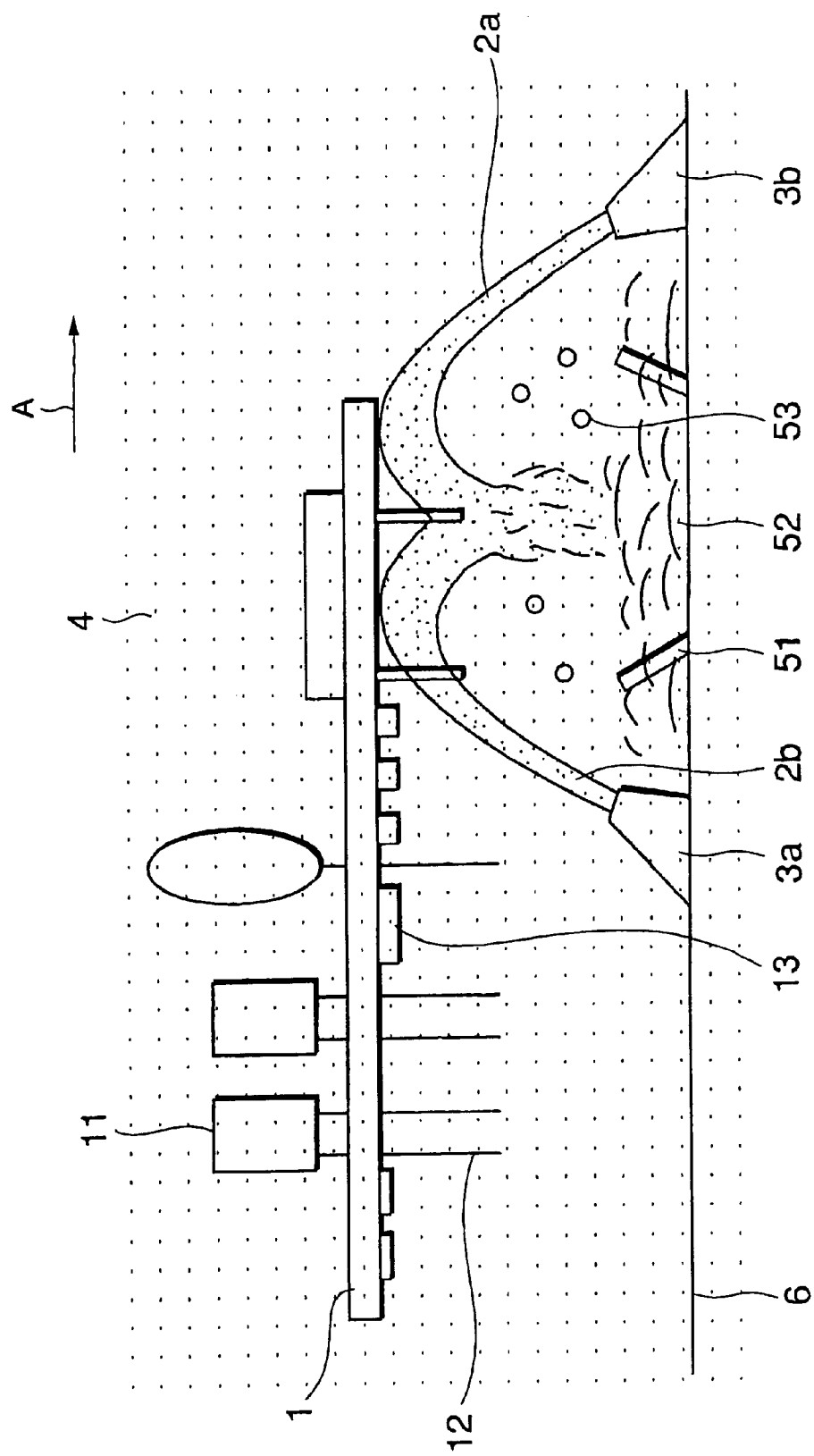
FIG. 13 shows a side view for describing the soldering process illustrated in FIG. 12.

Referring to FIGS. 12 and 13, the solder jetting nozzles 3a and 3b are arranged in the inert gas atmosphere so as to face each other. The solder jetting nozzles 3a and 3b jet the solders 2a and 2b, respectively. The jet flows of the solders 2a and 2b are combined a predetermined or desired height. The both-side mounted printed-circuit board 1 is transferred in a direction of an arrow A. When the both-side mounted printed-circuit board 1 passes over the combined point of the jet flows of the solders 2a and 2b, the soldering is carried out to the lead 12 of the electronic device 11 and the surface-mounted device 13 on the back surface. Each of the solder jetting nozzles 3a and 3b is similar in structure to the solder jetting nozzle 3 illustrated in FIG. 7. It is possible to make the height of the jet flows of the solders 2a and 2b to be a desired height. Furthermore, it is possible to make the curtain thickness of the solder jet flow curtain be a desired curtain thickness.

Inasmuch as the solders 2a and 2b are jetted high in the inert gas atmosphere 4 from the solder jetting nozzles 3a and 3b, respectively, the surfaces of the solders 2a and 2b are not oxidized. When the oxygen concentration is made lower than 100 ppm by the inert gas, the solder ball 53 may occur. As described above, the solders 2a and 2b are jetted high from the solder jetting nozzles 3a and 3b. Inasmuch as the jet flow curtain of the solders 2a and 2b is generated on the area in which the solder ball 53 is generated, the solder ball 53 is prevented from attaching to the both-side mounted printed-circuit board 1. In addition, the solder ball 53 may jump out from the side of the jet flow curtain of the solders 2a and 2b. The jumped solder ball 53 is shielded by the shielding member 51 having the perforated plate. By the shielding member 51, it is possible to prevent the molten solder from attaching to one of the solder jetting nozzles 3a and 3b when only the other of the solder jetting nozzles 3a and 3b forms the jet flow curtain of the corresponding solders 2a and 2b.

The solder jet flow of the solder jetting nozzle 3a is stopped just before all of the both-side mounted printed-circuit boards 1 pass over the combined point of the jet flows of the solders 2a and 2b. The solder jetting nozzles 3a and 3b are controlled so as to repeatedly jet and stop the solders 2a and 2b at every time the both-side printed-circuit board 1 is transferred thereto by the carrier 41.

By the way, the inert gas may be taken below the melt surface 6 of the molten solder by the lowered jet flows of the solders 2a and 2b on stopping only one of the solder jetting nozzles 3a and 3b. When the taken inert gas floats up and breaks, the solder ball 53 may occur. The shielding member 51 serves to shield the solder ball 53.

The solder jetting nozzles 3a and 3b are arranged so as to project from the melt surface 6 of the molten solder. Alternatively, the solder jetting nozzles 3a and 3b are arranged so as to beat the same level as the melt surface 6 of the molten solder. In addition, the solder jetting nozzles 3a and 3b are arranged so as to make the jet flow of the solder 2b face the both-side mounted printed-circuit board 1 transferred thereto.

Referring to FIGS. 12 and 13, description will be made about a soldering process according to another embodiment of the invention. The solders 2a and 2b jetted from the solder jetting nozzles 3a and 3b are combined at an intermediate position between the solder jetting nozzles 3a and 3b. The solders 2a and 2b drop down to the drop point 52 of the melt surface 6 of the molten solder. The solders 2a and 2b are rebounded from the melt surface 6 of the molten solder. As a result, the solder ball 53 may be generated. Inasmuch as the portion above the solder ball 53 is covered by the jet flow curtains of the solders 2a and 2b jetted from each of the solder jetting nozzles 3a and 3b, the solder ball 53 does not ascend above the jet flow curtains of the solders 2a and 2b.

Accordingly, it is possible to improve working efficiency with stabilization of soldering quality. It is possible to prevent the solder ball 53 from attaching to the both-side mounted printed-circuit board 1.

Figure 14:
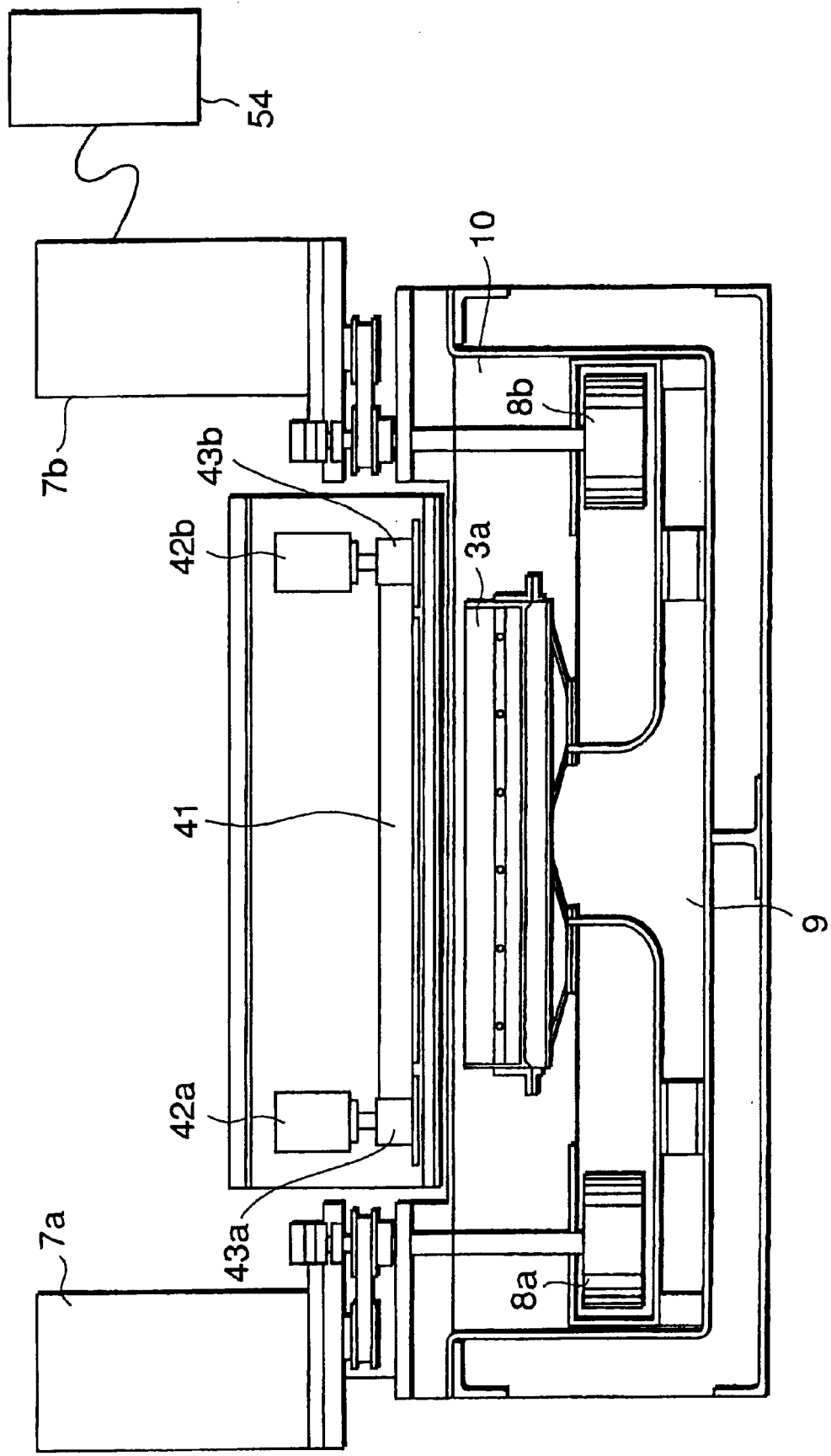
FIG. 14 shows a side view with a partial section of an automatic soldering mechanism according to still another embodiment of this invention.

Referring to FIGS. 14 and 15, description will proceed to an automatic soldering mechanism according to a still another embodiment of this invention. The illustrated automatic soldering mechanism comprises solder jetting nozzles 3a and 3b, motors 7a to 7d (motors 7c and 7d are not illustrated), fans 8a to 8d (fans 8c and 8d are not illustrated), a piping 9, a solder tank 10, a carrier 41, drive motors 42a and 42b, carrier transferring chains 43a and 43b, an inverter 54, a restricting plate 55, and carrier transferring chain hooks 56a and 56b.

The carrier 41 carries the both-side mounted printed-circuit board 1 to circulates within the automatic soldering apparatus. The drive motors 42a and 42b and the carrier transferring chains 43a and 43b are arranged on both sides of the carrier 41 so as to hold the carrier 41 therebetween. The drive motors 42a and 42b rotate the carrier transferring chains 43a and 43b in a direction opposite to each other (directions of arrows F and G) to transfer the carrier 41 in a direction of an arrow A by the carrier transferring chain hooks 56a and 56b.

When the fans 8a to 8d are rotated by the motors 7a to 7d, the solders 2a and 2b are taken into the piping 9 from the solder tank 10 by the fans 8a to 8d. The solders 2a and 2b are jetted from the solder jetting nozzles 3a and 3b, respectively. Although an unnecessary material such as an oxide may float on the melt surface 6 of the molten solder, the unnecessary material is not taken into the piping 9 by the above-mentioned operation.

The heights of the jet flows of the solders 2a and 2b are dependent upon a rotational speed of the motors 7a to 7d. In order to adjust the heights of the jet flows of the solders 2a and 2b, the inverter controls the motors 7a to 7d. Inasmuch as the inverter 54 can control a rotational cycle of the motors 7a to 7d to a degree of about 0 to 60 Hz, it is possible to make the heights of the jet flows of the solders 2a and 2b be optionally set within the range of the height in accordance with the rotational cycle.

The restricting plate 55 is arranged at a connecting port side of each of the fans 8a to 8d to the piping 9 in an outer peripheral portion. The restricting plate 55 restricts a part of the molten solder transferred to the piping 9 from each fans 8a to 8d, in order to prevent of the interference with the jet flow curtains. In addition, the restricting plate 55 prevents the molten solder from returning to the fans 8a to 8d without being jetted from the solder jetting nozzles 3a and 3b. It is possible to of the jet flow curtains stabilize the solders 2a and 2b.

Figure 16A:
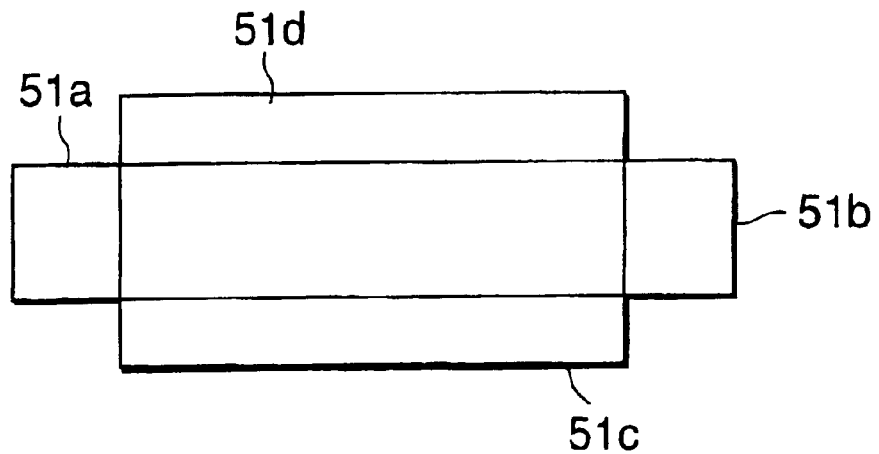
FIG. 16A shows a plan view of the shielding member illustrated in FIG. 12.
Figure 16B:
FIG. 16B shows a side view of the shielding member illustrated in FIG. 12.
Figure 16C:
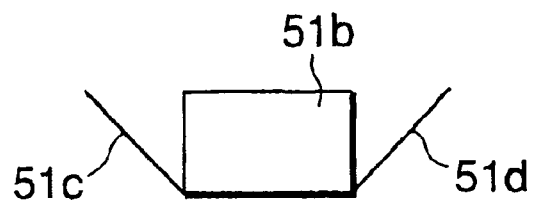
FIG. 16C shows a front view of the shielding member illustrated in FIG. 12.

Referring to FIGS. 16A to 16C, the shielding member 51 is composed of perforated plates 51a to 51d. The perforated plates 51a and 51b are bent in a reverse direction to each other. The perforated plates 51c and 51d are bent in the same direction. The bending angle is set so as to shield the solder ball 53 generated by a rebound of the jet flow curtains of the solders 2a and 2b at a drop point 52. In addition, the shielding member 51 is mounted to the solder jetting nozzles 3a and 3b or the solder tank 10 by a supporting member (not shown) so as to be positioned near the drop point 52 of the jet flow curtains of the solders 2a and 2b. The mounting position of the shielding member 51 is set so as to shield the solder ball 53 generated by the rebound of the jet flow curtains of the solders 2a and 2b at the drop point 52. When only one of the solder jetting nozzles 3a and 3b forms the jet flow curtains of the corresponding solders 2a and 2b, the molten solder is not brought into contact with the other of the solder jetting nozzles 3a and 3b by the shielding member 51. On stopping only one of the solder jetting nozzles 3a and 3b, the inert gas may be taken below the melt surface 6 of the molten solder by the lowered jet flows of the solders 2a and 2b. The taken inert gas floats up and breaks so that the solder ball 53 is generated. The shielding member 51 serves to shield the solder ball 53.

As described above, the jet flows are jetted high above each of the solder jetting nozzles in the inert gas atmosphere. The height of each of the jet flows becomes greater than the length of the lead 12 of the electronic device 11. On carrying out the soldering, the lead 12 of the electronic device 11 is not brought into contact with each of the solder jetting nozzles. As a result, it is possible to enter into the soldering process only by inserting the both-side mounted printed-circuit board 1.

Accordingly, it is possible to working efficiency and stabilization of soldering quality without deteriorating the stability of electronic device 11. and the soldering quality. In addition, it is possible to cut the lead 12 by the automatic cutter mechanism 27 after soldering. On jetting the solders 2a and 2b high from each of the solder jetting nozzles 3a and 3b in the inert gas atmosphere 4, the solders 2a and 2b are jetted from both directions so that the solders 2a and 2b are faced each other, in order to drop the jet flow after the solders 2a and 2b are combined into one jet flow. When the solder ball 53 is generated by the rebound of the solders 2a and 2b from the melt surface 6 of the molten solder, it is possible to shield the solder ball 53 by the jet flow curtains of the solders 2a and 2b from each of the solder jetting nozzles 3a and 3b. Inasmuch as the solder ball 53 does not ascend above the jet flow curtains of the solders 2a and 2b, it is possible to improve working efficiency and stabilize soldering quality. In addition, it is possible to prevent the solder ball 53 from attaching to the both-side mounted printed-circuit board 1. As a result, it is possible to improve the soldering quality and the working efficiency.

While this invention has thus far been described in conjunction with the preferred embodiments thereof, it will readily be possible for those skilled in the art to put this invention into practice in the various other manners.

What is claimed is:

1. An automatic soldering mechanism for jetting a solder jet flow to a printed-circuit board moving in a predetermined direction, said automatic soldering mechanism comprising:
   a solder tank for storing molten solder;
   solder jetting nozzle means in said solder tank for jetting a solder jet flow higher than a melt surface of the molten solder in an inert gas atmosphere,
   said solder tank comprising a lift that moves said solder tank in a first direction perpendicular to the predetermined direction.

2. An automatic soldering mechanism as claimed in claim 1, wherein said solder jet flow has a solder width greater than a width of printed-circuit board in a second direction that is perpendicular to said predetermined direction and to said first direction.

3. An automatic soldering mechanism as claimed in claim 1, wherein said solder jetting nozzle means has a discharge port of which an opening area is variable.

4. An automatic soldering mechanism as claimed in claim 1, further comprising supplying means for supplying said molten solder from said solder tank to said solder jetting nozzle means, said supplying means changing a supply amount of said molten solder to vary a height of said solder jet flow from said supply means to said solder jetting nozzle means.

5. An automatic soldering mechanism as claimed in claim 3, wherein said discharge port is positioned at a position substantially equal to the melt surface of said molten solder.

6. An automatic soldering mechanism as claimed in claim 3, wherein said discharge port is positioned at a position higher than the melt surface of said molten solder.

7. An automatic soldering mechanism as claimed in claim 1, further comprising shielding means disposed near a point at which said solder jet flow drops onto said the molten solder for shielding a solder ball due to a drop of said solder jet flow.

8. An automatic soldering mechanism as claimed in claim 1, further comprising adjusting means for adjusting a jetting angle of the solder jet flow.

9. An automatic soldering mechanism as claimed in claim 1, wherein:
   said printed-circuit board has front and back surfaces;
   a part having a lead of a predetermined length being mounted on at least said front surface;
   said lead projecting from said front surface to said back surface.

10. An automatic soldering mechanism as claimed in claim 1, wherein:
    said printed-circuit board has front and back surfaces;
    a part having a lead of a predetermined length being mounted on said front surface, said lead projecting from said front surface to said back surface; and
    a surface-mounted device being mounted on said back surface.

11. An automatic soldering mechanism as claimed in claim 1, wherein said solder jetting nozzle means is positioned so as to jet said solder jet flow in a direction reverse to the predetermined direction near a top portion of said solder jet flow.

12. An automatic soldering mechanism as claimed in claim 1, wherein said solder jetting nozzle means comprises first and second solder jetting nozzles.

13. An automatic soldering mechanism as claimed in claim 12, wherein said first and said second solder jetting nozzles jet first and second solder jet flows, respectively, said second solder jetting nozzle jetting said second jet flow in the predetermined direction near a top portion of said second solder jet flow;

said first and second solder jetting nozzles being disposed so that said first and said second solder jet flows are combined at a point intermediate to said first and said second jetting nozzles.

14. An automatic soldering apparatus for jetting a solder jet flow to a printed-circuit board having at least one lead to carry out a soldering of said printed-circuit board, said automatic soldering apparatus comprising:

a board carrier mechanism for carrying said printed-circuit board;

a flux applying mechanism for applying a flux to a back surface of said printed-circuit board on said board carrier mechanism to process said printed-circuit board into a flux board;

a preliminary heating mechanism for preliminarily heating said flux board into a heated board;

an automatic soldering mechanism comprising a solder tank for storing a molten solder and a solder jetting nozzle means for jetting said solder jet flow higher than a melt surface of said molten solder within said solder tank in an inert gas atmosphere, said automatic soldering mechanism carrying out said soldering to said heated board to process said heated board into a soldered board;

a cooling mechanism for cooling said soldered board into a cooled board; and an automatic cutter mechanism for cutting the lead of said cooled board to a predetermined length.

15. An automatic soldering apparatus as claimed in claim 14, wherein said printed circuit board is transferred in a predetermined direction, and said solder jet flow has a solder width greater than a width of the printed-circuit board in a direction that is perpendicular to said predetermined direction.

16. An automatic soldering apparatus as claimed in claim 14, wherein said solder jetting nozzle means has a a discharge port of which an opening area is variable.

17. An automatic soldering apparatus as claimed in claim 14, wherein said automatic soldering mechanism further comprises supplying means for supplying said molten solder from said solder tank to said solder jetting nozzle means, said supplying means changing a supply amount of said molten solder to vary a height of said solder jet flow from said supply means to said solder jetting nozzle means.

18. An automatic soldering apparatus as claimed in claim 16, wherein said discharge port is positioned at a position substantially equal to the melt surface of said molten solder.

19. An automatic soldering apparatus as claimed in claim 16, wherein said discharge port is positioned at a position higher than the melt surface of said molten solder.

20. An automatic soldering apparatus as claimed in claim 14, wherein said automatic soldering mechanism further comprises shielding means disposed near a point at which said solder jet flow drops onto said melt surface, said shielding means shielding a solder ball due to a drop of said solder jet flow.

21. An automatic soldering mechanism as claimed in claim 14, wherein said automatic soldering mechanism further comprises supporting means for supporting said solder jetting nozzle means to vary a jetting angle of said solder jet flow.

22. An automatic soldering mechanism as claimed in claim 15, wherein said automatic soldering mechanism further comprises vertical movement means for moving said solder tank to a direction perpendicular to said predetermined direction.

23. An automatic soldering apparatus as claimed in claim 14, wherein:

said printed-circuit board has front and back surfaces;

a part having a lead of a predetermined length being mounted on at least said front surface;

said lead projecting from said front surface to said back surface.

24. An automatic soldering apparatus as claimed in claim 14, wherein:

said printed-circuit board has front and back surfaces;

a part having a lead of a predetermined length being mounted on said front surface, said lead projecting from said front surface to said back surface; and a surface-mounted device being mounted on said back surface.

25. An automatic soldering apparatus as claimed in claim 14, further comprising a supply mechanism for supplying an inert gas to each of said preliminary heating mechanism, said automatic soldering mechanism, and said cooling mechanism.

26. An automatic soldering apparatus as claimed in claim 15, wherein said solder jetting nozzle means is positioned so as to jet said solder jet flow in a direction reverse to the predetermined direction near a top portion of said solder jet flow.

27. An automatic soldering apparatus as claimed in claim 15, wherein said solder jetting nozzle means comprises first and second solder jetting nozzles.

28. An automatic soldering apparatus as claimed in claim 27, wherein said first and said second solder jetting nozzles let first and second solder jet flows, respectively, said second solder jetting nozzle jetting said second solder jet flow in the predetermined direction near a top portion of said second solder jet flow;

said first and second solder jetting nozzles being disposed so that said first and said second solder jet flows are combined at a point intermediate to said first and said second jetting nozzles.

29. An automatic soldering mechanism to solder a printed-circuit board, the automatic soldering mechanism comprising:

a solder tank storing molten solder; and a solder jet nozzle discharging a solder jet flow higher than a surface of the molten solder within said solder tank and onto a surface of the printed-circuit board, said solder jet nozzle having an adjustable discharge opening that controls a thickness of the solder jet flow.

30. The automatic soldering mechanism of claim 29, wherein said solder jet nozzle has an adjustable discharge angle relative to the surface of the molten solder.

31. The automatic soldering mechanism of claim 29, further comprising a solder ball shielding member rising above the surface of the molten solder at a splash zone of the solder jet flow, said solder ball shielding member shielding said solder jet nozzle from a solder ball rebounding from said splash zone.

* * * * *